United States Patent
Athalye

(10) Patent No.: US 9,285,082 B2
(45) Date of Patent: Mar. 15, 2016

(54) LED LAMP WITH LED BOARD HEAT SINK

(71) Applicant: Cree, Inc., Durham, NC (US)

(72) Inventor: Praneet Athalye, Morrisville, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/852,040

(22) Filed: Mar. 28, 2013

(65) Prior Publication Data
US 2014/0292176 A1    Oct. 2, 2014

(51) Int. Cl.

| | |
|---|---|
| F21V 29/00 | (2015.01) |
| F21K 99/00 | (2010.01) |
| F21V 29/70 | (2015.01) |
| F21V 29/503 | (2015.01) |
| F21V 19/00 | (2006.01) |
| F21V 3/00 | (2015.01) |
| F21Y 101/02 | (2006.01) |
| F21Y 111/00 | (2006.01) |

(52) U.S. Cl.
CPC .............. *F21K 9/135* (2013.01); *F21V 19/0035* (2013.01); *F21V 29/503* (2015.01); *F21V 29/70* (2015.01); *F21V 3/00* (2013.01); *F21Y 2101/02* (2013.01); *F21Y 2111/002* (2013.01)

(58) Field of Classification Search
CPC ....... F21V 29/00; F21V 29/04; F21V 29/002; F21V 29/004; F21V 29/503; F21V 29/70; F21V 19/0035
USPC ..................................... 313/46; 362/294, 373
See application file for complete search history.

(56) References Cited

U.S. PATENT DOCUMENTS

| | | | |
|---|---|---|---|
| 3,581,162 | A | 5/1971 | Wheatley |
| 5,463,280 | A | 10/1995 | Johnson |
| 5,561,346 | A | 10/1996 | Byrne |
| 5,585,783 | A | 12/1996 | Hall |
| 5,655,830 | A | 8/1997 | Ruskouski |
| 5,688,042 | A | 11/1997 | Madadi et al. |
| 5,806,965 | A | 9/1998 | Deese |
| 5,947,588 | A | 9/1999 | Huang |
| 5,949,347 | A | 9/1999 | Wu |
| 6,220,722 | B1 | 4/2001 | Begemann |
| 6,227,679 | B1 | 5/2001 | Zhang et al. |
| 6,234,648 | B1 | 5/2001 | Borner et al. |
| 6,250,774 | B1 | 6/2001 | Begemann et al. |
| 6,276,822 | B1 | 8/2001 | Bedrosian et al. |
| 6,465,961 | B1 | 10/2002 | Cao |
| 6,523,978 | B1 | 2/2003 | Huang |

(Continued)

FOREIGN PATENT DOCUMENTS

| | | | |
|---|---|---|---|
| CN | 103375693 A | * | 10/2013 |
| EP | 1058221 A2 | | 12/2000 |

(Continued)

OTHER PUBLICATIONS

U.S. Appl. No. 14/259,232, filed Apr. 23, 2014.

*Primary Examiner* — Mariceli Santiago
(74) *Attorney, Agent, or Firm* — Dennis J. Williamson; Moore & Van Allen PLLC

(57) ABSTRACT

A LED lamp includes an optically transmissive enclosure and a base connected to the enclosure. LEDs are mounted on a substrate for emitting light when energized though an electrical path from the base. The mounting substrate for the LEDs has a surface that is exposed to the exterior of the enclosure for transmitting heat from the plurality of LEDs and dissipating heat to the ambient environment.

38 Claims, 14 Drawing Sheets

(56) References Cited

U.S. PATENT DOCUMENTS

| | | |
|---|---|---|
| 6,550,953 B1 | 4/2003 | Ichikawa et al. |
| 6,634,770 B2 | 10/2003 | Cao |
| 6,659,632 B2 | 12/2003 | Chen |
| 6,709,132 B2 | 3/2004 | Ishibashi |
| 6,803,607 B1 | 10/2004 | Chan et al. |
| 6,848,819 B1 | 2/2005 | Arndt et al. |
| 6,864,513 B2 | 3/2005 | Lin et al. |
| 6,948,829 B2 | 9/2005 | Verdes et al. |
| 6,982,518 B2 | 1/2006 | Chou et al. |
| 7,048,412 B2 | 5/2006 | Martin et al. |
| 7,080,924 B2 | 7/2006 | Tseng et al. |
| 7,086,756 B2 * | 8/2006 | Maxik ............... 362/249.04 |
| 7,086,767 B2 | 8/2006 | Sidwell et al. |
| 7,144,135 B2 | 12/2006 | Martin et al. |
| 7,165,866 B2 | 1/2007 | Li |
| 7,172,314 B2 | 2/2007 | Currie et al. |
| 7,213,940 B1 | 5/2007 | Van De Ven et al. |
| 7,354,174 B1 | 4/2008 | Yan |
| 7,396,142 B2 | 7/2008 | Laizure, Jr. et al. |
| 7,600,882 B1 | 10/2009 | Morejon et al. |
| 7,726,836 B2 | 6/2010 | Chen |
| 7,824,065 B2 | 11/2010 | Maxik |
| 8,004,172 B2 | 8/2011 | Hussell et al. |
| 8,013,501 B2 * | 9/2011 | Carroll et al. ............... 313/46 |
| 8,021,025 B2 | 9/2011 | Lee |
| 8,253,316 B2 | 8/2012 | Sun et al. |
| 8,272,762 B2 | 9/2012 | Maxik et al. |
| 8,274,241 B2 | 9/2012 | Guest et al. |
| 8,277,082 B2 | 10/2012 | Dassanayake et al. |
| 8,282,250 B1 | 10/2012 | Dassanayake et al. |
| 8,292,468 B2 | 10/2012 | Narendran et al. |
| 8,322,896 B2 | 12/2012 | Falicoff et al. |
| 8,371,722 B2 | 2/2013 | Carroll |
| 8,400,051 B2 | 3/2013 | Hakata et al. |
| 8,415,865 B2 | 4/2013 | Liang et al. |
| 8,421,320 B2 | 4/2013 | Chuang |
| 8,421,321 B2 | 4/2013 | Chuang |
| 8,421,322 B2 | 4/2013 | Carroll et al. |
| 8,421,329 B2 | 4/2013 | Liang et al. |
| 8,449,154 B2 | 5/2013 | Uemoto et al. |
| 8,502,468 B2 | 8/2013 | Li et al. |
| 8,641,237 B2 | 2/2014 | Chuang |
| 8,653,723 B2 | 2/2014 | Cao et al. |
| 8,696,168 B2 | 4/2014 | Li et al. |
| 8,740,415 B2 | 6/2014 | Wheelock |
| 8,750,671 B1 | 6/2014 | Kelly et al. |
| 8,752,984 B2 | 6/2014 | Lenk et al. |
| 8,760,042 B2 | 6/2014 | Sakai et al. |
| 2004/0201990 A1 | 10/2004 | Meyer |
| 2009/0184618 A1 | 7/2009 | Hakata et al. |
| 2009/0302730 A1 | 12/2009 | Carroll et al. |
| 2011/0103055 A1 * | 5/2011 | Carroll ............... 362/235 |
| 2011/0273102 A1 | 11/2011 | Van De Ven et al. |
| 2012/0040585 A1 | 2/2012 | Huang |
| 2012/0043878 A1 * | 2/2012 | Liang et al. ............... 313/317 |
| 2012/0218774 A1 | 8/2012 | Livingston |
| 2012/0243230 A1 * | 9/2012 | Carroll et al. ............... 362/249.02 |
| 2013/0026923 A1 | 1/2013 | Athalye et al. |
| 2013/0026925 A1 | 1/2013 | Ven et al. |
| 2013/0027904 A1 * | 1/2013 | Fan ............... 362/84 |
| 2013/0069535 A1 | 3/2013 | Athalye |
| 2013/0069547 A1 | 3/2013 | Van De Ven et al. |
| 2013/0127353 A1 | 5/2013 | Athalye et al. |
| 2013/0162149 A1 | 6/2013 | Van De Ven et al. |
| 2013/0162153 A1 | 6/2013 | Van De Ven et al. |
| 2013/0169159 A1 | 7/2013 | Lys |
| 2013/0229801 A1 * | 9/2013 | Breidenassel et al. ............... 362/235 |
| 2013/0293135 A1 | 11/2013 | Hu et al. |

FOREIGN PATENT DOCUMENTS

| | | |
|---|---|---|
| EP | 0890059 B1 | 6/2004 |
| GB | 2345954 A | 7/2000 |
| JP | H09265807 A | 10/1997 |
| JP | 2000173304 A | 6/2000 |
| JP | 2001118403 A | 4/2001 |
| JP | 2007059930 A | 3/2007 |
| JP | 2008288183 A | 11/2008 |
| JP | 2009117346 A | 5/2009 |
| JP | 3153766 U | 9/2009 |
| JP | 2009277586 A | 11/2009 |
| WO | 0124583 A1 | 4/2001 |
| WO | 0160119 A2 | 8/2001 |
| WO | 2012011279 A1 | 1/2012 |
| WO | 2012031533 A1 | 3/2012 |
| WO | WO 2013153116 A1 * | 10/2013 |

* cited by examiner

LED LAMP WITH LED BOARD HEAT SINK

BACKGROUND

Light emitting diode (LED) lighting systems are becoming more prevalent as replacements for older lighting systems. LED systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting system may take the form of a lighting unit, light fixture, light bulb, or a "lamp."

An LED lighting system may include, for example, a packaged light emitting device including one or more light emitting diodes (LEDs), which may include inorganic LEDs, which may include semiconductor layers forming p-n junctions and/or organic LEDs (OLEDs), which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken.

An LED lamp may be made with a form factor that allows it to replace a standard incandescent bulb, or any of various types of fluorescent lamps. Since, ideally, an LED lamp designed as a replacement for a traditional incandescent or fluorescent light source needs to be self-contained; a power supply may be included in the lamp structure along with the LEDs or LED packages and the optical components. A heatsink is also often needed to cool the LEDs and/or power supply in order to maintain appropriate operating temperature.

SUMMARY OF THE INVENTION

In one embodiment an LED lamp comprises an enclosure that is at least partially optically transmissive and a base connected to the enclosure. A plurality of LEDs are mounted on a substrate for emitting light when energized though an electrical path from the base. The substrate has a surface that is exposed to the exterior of the enclosure for transmitting heat from the plurality of LEDs and dissipating heat to the ambient environment.

The base may comprise an Edison base. The plurality of LEDs may be disposed near the surface of the enclosure and may be positioned to direct light primarily inwardly toward a center of the enclosure. The plurality of LEDs may be disposed about the periphery of the enclosure. The substrate may be made of a single one-piece part or a plurality of separate parts. The substrate may be made of a thermally conductive material. The second surface of the substrate may be generally smooth. The plurality of LEDs may be mounted on a mounting surface of the substrate, and the surface of the substrate and the mounting surface may be the same physical component. The plurality of LEDs may be mounted directly to the substrate. The thickness of the substrate may be within the range of approximately 0.25 mm to 5 mm and any sub-range therebetween. The outer dimensions of the lamp may fall within the ANSI standards for an A19 bulb. Electrical conductors for providing current to the plurality of LEDs may be formed on the substrate. The substrate may comprise one of aluminum board, PCB, flexible PCB, MCPCB, or any suitable thermally conductive substrate for mounting LEDs. The substrate may be formed into a three-dimensional shape that comprises portions that are shaped to conform to the shape of the enclosure such that when the substrate is mounted to the enclosure the substrate forms part of the enclosure. The substrate may be bent along score lines. The score lines may comprise thinned areas of the substrate. The enclosure may comprise apertures and the substrate may comprise portions that fit into the apertures. The substrate may comprise a plurality of fingers where each finger supports at least one LED. The plurality of fingers may be connected to one another by a support. The fingers and support may be formed of a single piece of material. The support may be generally ring shaped. The support may be positioned between the base and the enclosure. The support may be positioned inside the base. The support may be positioned outside of the enclosure. The plurality of fingers may extend from one side of the support with the plurality of LEDs facing inwardly. The plurality of fingers extend from both sides of the support. The support may be located at the approximate equator of the enclosure with the fingers disposed above and below the support. The support may be positioned between a first and a second enclosure portion. The support may be disposed on a longitudinal line of the bulb. The plurality of fingers may be formed to follow the curvature of the enclosure. The plurality of LEDs may face at various angles relative to the longitudinal axis of the lamp. A sufficient portion of the substrate is exposed to the ambient environment that heat is dissipated from the plurality of LEDs via the substrate. The lamp may be a directional lamp comprising a reflective surface, the substrate being mounted on the enclosure such that it is physically spaced from the base. The substrate may be mounted between the enclosure and a lens. The lens may define an exit surface of the lamp. The substrate may comprise a support mounted between the enclosure and a lens. A plurality of fingers may extend from the support toward the base. A power supply may be located in the base and the substrate may be physically spaced from the base. The fingers may extend from the support toward the distal end of the bulb and extend only to the equator of the enclosure. The base may comprise a housing portion that extends into the center of the enclosure. The housing portion may contain at least a portion of the lamp electronics. A reflective surface may be provided on an exterior surface of the housing portion such that the housing portion reflects light outwardly toward the enclosure.

DETAILED DESCRIPTION

Figure 1:
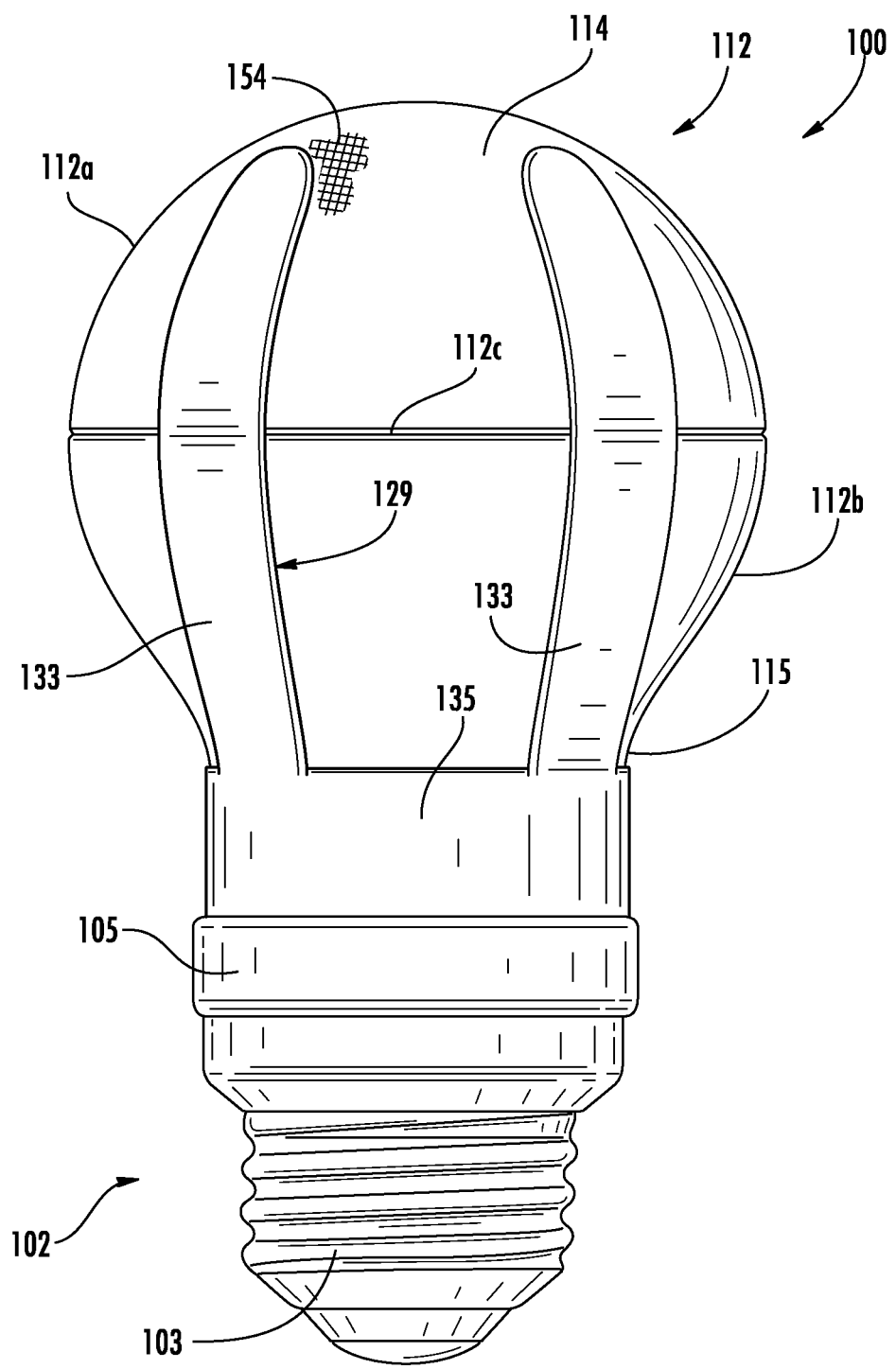
FIG. 1 is a plan view of an embodiment of a lamp of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED device" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Figure 2:
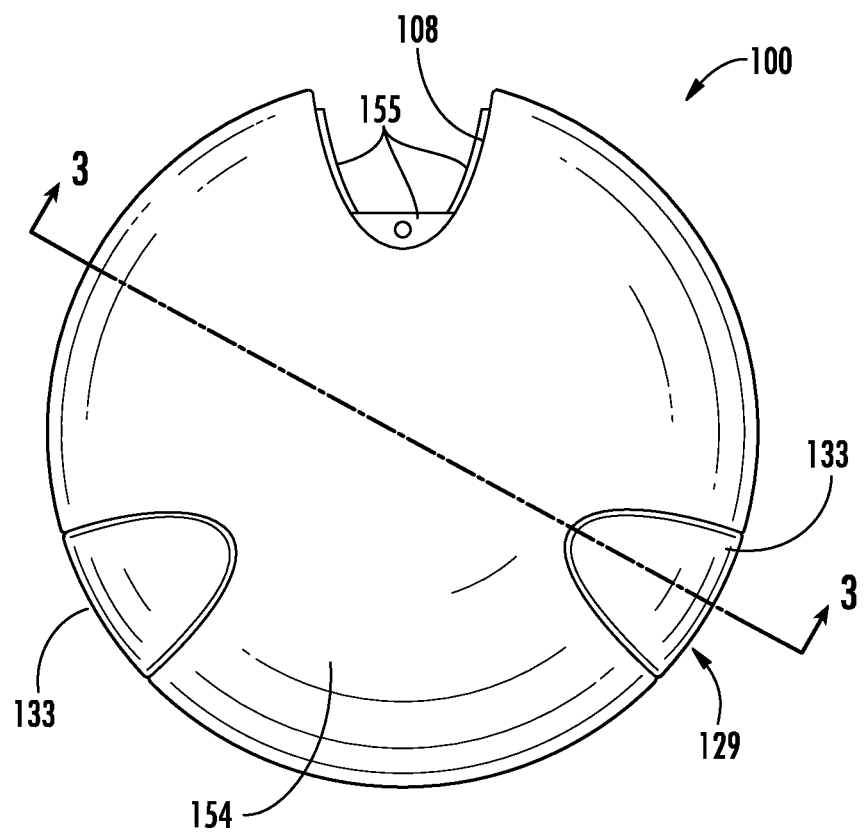
FIG. 2 is a top view of the lamp of FIG. 1 with a portion of the substrate removed.
Figure 3:
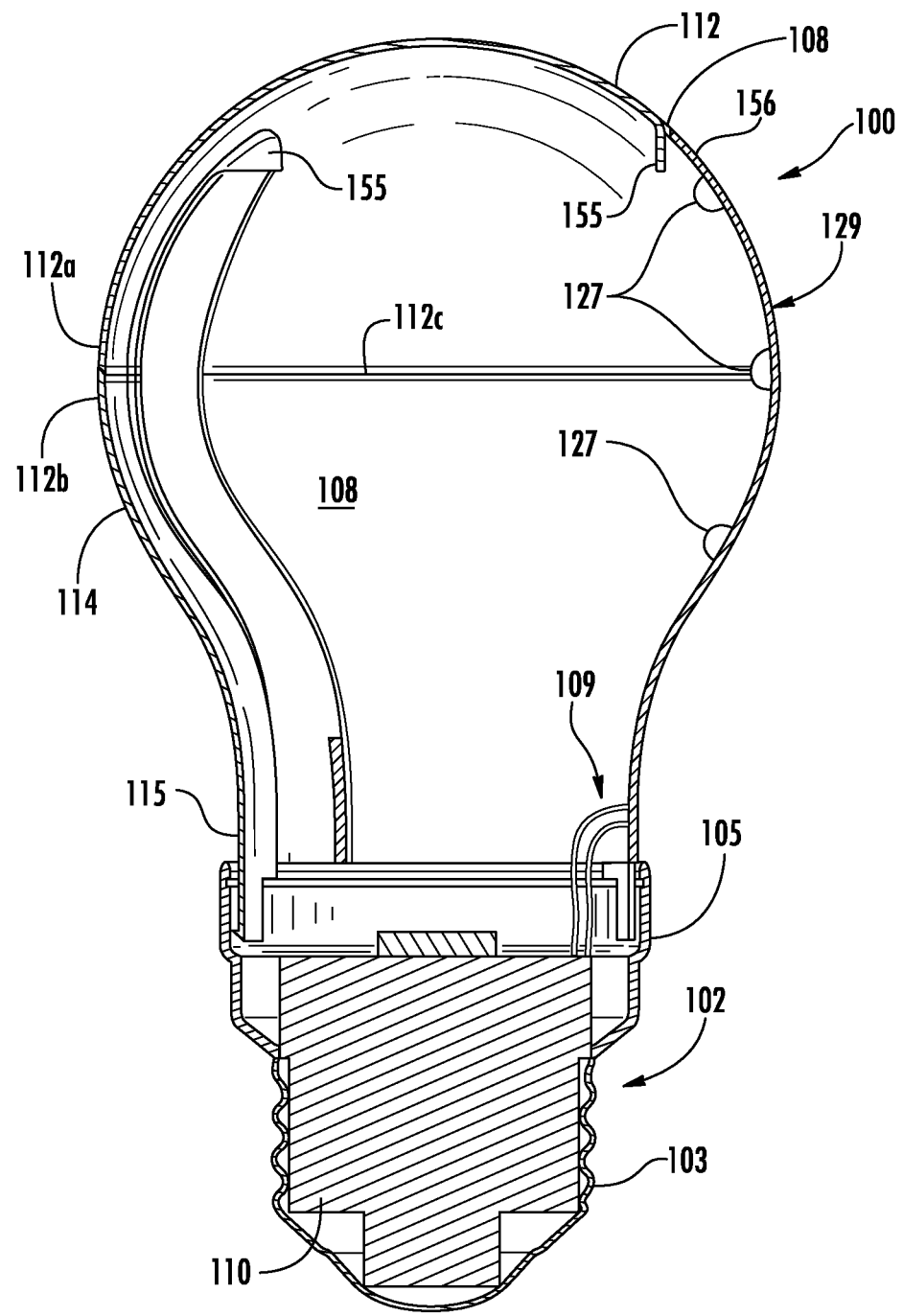
FIG. 3 is a section view taken along line 3-3 of FIG. 2.

FIGS. 1, 2 and 3 show a lamp 100 according to some embodiments of the present invention. Lamp 100 comprises a base 102 connected to an optically transmissive enclosure 112. Lamp 100 may be used as an A-series lamp with an Edison base 102; more particularly, lamp 100 may be designed to serve as a solid-state replacement for an A19 incandescent bulb. The Edison base 102 as shown and described herein may be implemented through the use of an Edison connector 103 and a form 105. LEDs 127 are mounted on a substrate 129 and are operable to emit light when energized through an electrical connection through the Edison base 102. The substrate 129 supports the individual LEDs, LED chips or LED packages 127 (hereinafter "LEDs"). In some embodiments, electrical circuitry may be provided on the substrates for delivering electric current to the LEDs 127. While a lamp having the size and form factor of a standard-sized household incandescent bulb is shown, the lamp may have other the sizes and form factors.

Enclosure 112 is, in some embodiments, made of glass, quartz, borosilicate, silicate, polycarbonate, other plastic or other suitable material. The enclosure 112 may be of similar shape to that commonly used in household incandescent bulbs. It should also be noted that the enclosure 112 or a portion of the enclosure could be coated or impregnated with phosphor. The enclosure 112 may have a traditional bulb shape having a globe shaped main body 114 that tapers to a narrower neck 115. In one embodiment the enclosure may be made of a plastic such as acrylic. The enclosure 112 may be transparent or translucent such that the light emitted into the interior of the enclosure, passes through the enclosure and is emitted from the enclosure. The enclosure may be formed of a light diffusing material or a light diffusing material 154 may be added to a transparent enclosure.

Referring to FIGS. 1-4, the enclosure 112 may be formed of an upper portion 112a and a lower portion 112b where the portions may be fit together at seam 112c to form the enclosure 112. The portions 112a and 112b may be joined by a friction fit, adhesive, mechanical engagement or other connection mechanism. In one embodiment, the enclosure 112 is formed with apertures 108 that receive the substrate 129 such that the LEDs 127 are disposed adjacent the wall of the enclosure 112 and project light inwardly toward the interior of the enclosure 112.

A lamp base 102 such as an Edison base functions as the electrical connector to connect the lamp 100 to an electrical socket or other connector. Depending on the embodiment, other base configurations are possible to make the electrical connection such as other standard bases or non-standard bases. Base 102 may include the electronics 110 for powering lamp and may include a power supply and/or driver and form all or a portion of the electrical path between the mains and the LEDs 127. Base 102 may also include only part of the power supply circuitry while some components may reside on the substrate 129 or elsewhere in the enclosure 112. Electrical conductors 109 run between the LEDs 127 and the electronics in the lamp base 102 to carry both sides of the supply to provide critical current to the LEDs 127. The base 102 comprises an electrically conductive Edison screw 103 for connecting to an Edison socket and a housing portion 105 connected to the Edison screw. The Edison screw 103 may be connected to the housing portion 105 by adhesive, mechanical connector, welding, separate fasteners or the like. The housing portion 105 may comprise an electrically insulating material such as plastic. Further, the material of the housing portion 105 may comprise a thermally conductive material such that the housing portion 105 may form part of the heat sink structure for dissipating heat from the lamp 100. The housing portion 105 and the Edison screw 103 define an internal cavity for receiving the electronics 110 of the lamp including the power supply and/or drivers or a portion of the electronics for the lamp. The lamp electronics 110 are electrically coupled to the Edison screw 103 such that the electrical connection may be made from the Edison screw 103 to the lamp electronics 110. The base 102 may be potted to physically and electrically isolate and protect the lamp electronics 110. While an Edison base is shown the base may comprise any suitable connector for providing current to the lamp including a bayonet type connector or other connector.

The lamp 100 comprises a solid-state lamp comprising a plurality of LEDs 127. Multiple LEDs 127 can be used together. The LEDs 127 are mounted on substrate 129 where the substrate typically supports a plurality of LEDs 127. The substrate 129 comprises an efficient thermal conducting material. In one embodiment the substrate 129 may comprise an aluminum LED board. In other embodiments the substrate may comprise a lead frame structure, printed circuit board (PCB), flexible PCB metal core printed circuit board (MCPCB) or any suitable thermally conductive substrate for mounting the LEDs. In addition to being thermally conductive and providing physical support for the LEDs the substrate may also provide the electrical path between the electronics 110 in the base and the LEDs. The thickness of the substrate may be within the range of approximately 0.25 mm to 5 mm and any subrange therebetween. In some embodiments, conductive traces or wire traces 130 may be formed on the substrate 129 (FIG. 5) that form part of the electrical path between the lamp electronics 110 in the base 102 and the LEDs 127. In other embodiments, separate electric conductors may be provided to form the electrical path between the lamp electronics and the LEDs.

The substrate 129 provides the physical support for the LEDs 127 and properly positions the LEDs in the openings 108 adjacent the enclosure 112. In some embodiments low voltage LEDs may be used. For example, three sets of three LEDs with each LED having a forward voltage of about 3 Volts may be used, and each set of LEDs may be mounted on fingers 133 of substrate 129 and may be connected in series for a total of 27 volts for the nine total LEDs 127 of lamp 100. In other embodiments, high voltage LEDs may be used using boost voltage converter technology to improve efficiency of the lamp 100, for example, nine high voltage LEDs with each LED having a forward voltage of 24 volts and connected in series can be used to operate at 216 Volts.

The substrate 129 is arranged such that the LEDs 127 are disposed about the periphery of the enclosure 112 at or near the surface of the enclosure and are positioned to direct light primarily inwardly toward the center of the enclosure. The substrate 129 may be in electrical connection with the electronics 110 in the base 102 such that an electrical connection is established between the base and the LEDs 127 mounted on the substrates 129. The substrate 129 may comprise a single one-piece component or the substrate may comprise a plurality of separate components such as may be found in MCPCB. The substrate 129 may be considered a mount for the LEDs 127. The substrate 129 and LEDs 127 may be evenly spaced about the periphery of the enclosure 112 such that the light projected from the LEDs 127 projects over an equal area of the enclosure 112.

Figure 4:
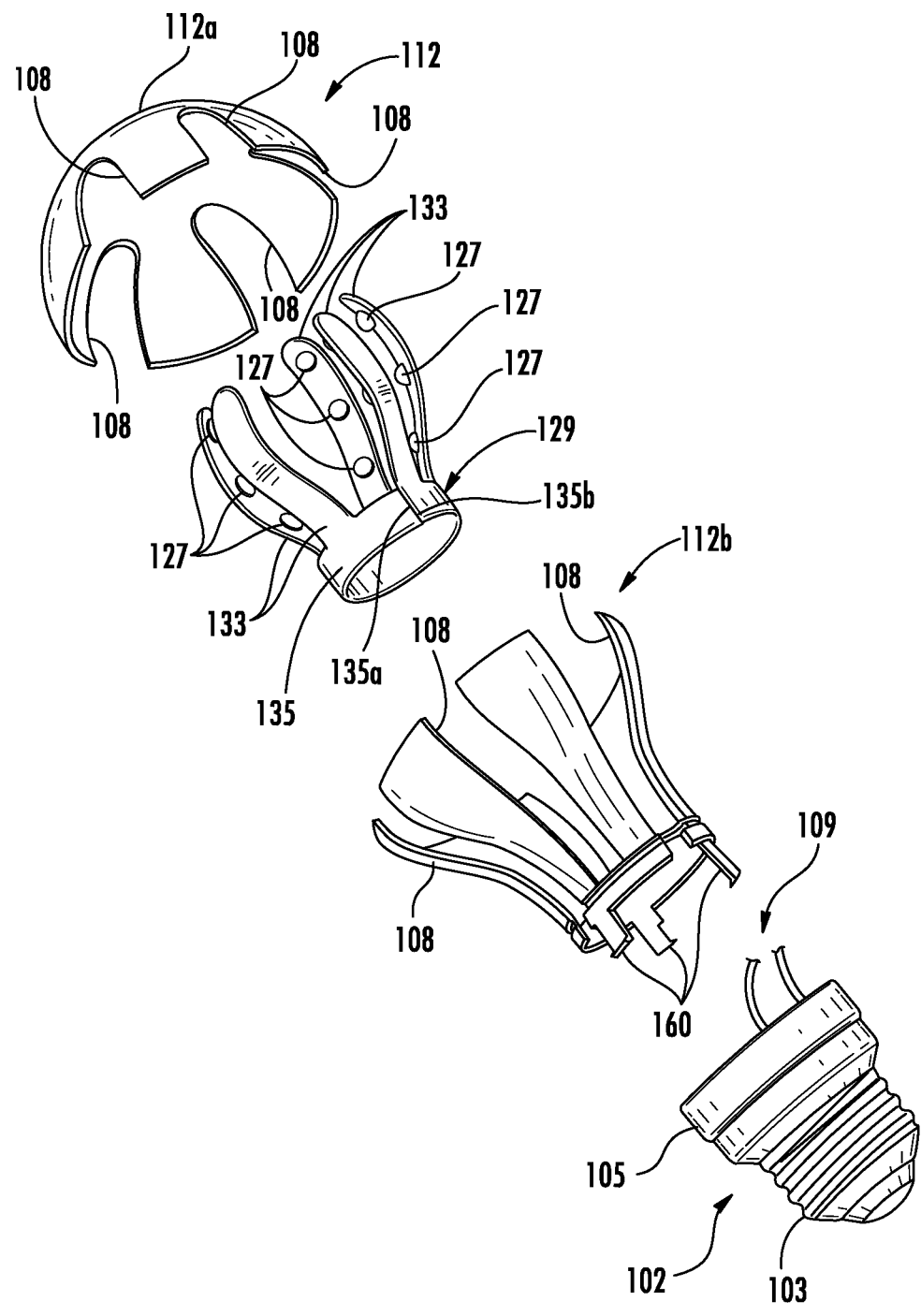
FIG. 4 is an exploded view of a lamp of the invention. 1.

For example, in the embodiment illustrated in FIGS. 1-3 the substrate 129 comprises three fingers 133 where each finger is disposed approximately 120 degrees from the adjacent fingers such that each set of LEDs covers about 120 degrees of the enclosure 112. In the embodiment of FIG. 4, five fingers are provided evenly spaced about the periphery of the enclosure. While in some embodiments the fingers are evenly spaced about the periphery of the enclosure the fingers need not be evenly spaced. The sets of LEDs 127 are arranged such that the light emitted from each set of LEDs overlaps with the light emitted from the other sets of LEDs. As a result, while each set of LEDs is arranged to project light over a portion of the enclosure the light from the sets of LEDs overlaps to a large degree. While lamps with three fingers and three sets of LEDs and five fingers and five sets of LEDs are shown, a greater or fewer number of fingers and associated LEDs may be used. The LEDs may be arranged in a variety of patterns on the substrate and relative to the enclosure.

The substrate 129 is made of a thermally conductive material such that heat generated by the LEDs 127 is transferred to the exterior of the enclosure 112 via the substrate. Because the LEDs 127 are thermally coupled to the substrate 129 and the substrate is exposed to the exterior of the enclosure, heat is transferred from the LEDs to the exterior of the bulb via the substrate over a short thermal path. In some embodiments, the substrate 129 can comprise a reflective coating, surface, layer and/or element on the mounting surface for the LEDs 127 that faces the interior of the enclosure 112. The substrate 129 comprises the mounting surface for the LEDs 127 where the LEDs are mounted on one surface of the substrate. Such an arrangement is distinguished from devices where the LEDs are mounted to a substrate where the substrate is located entirely in the enclosure and the substrate is mounted on or otherwise thermally coupled to a separate heat sink. In the present invention the mounting substrate for the LEDs is exposed to the exterior of the enclosure. The element that forms the mounting surface for the LEDs and the heat sink are the same physical element and may comprise a LED board or other similar component. The LEDs 127 are mounted directly to the substrate 129 where "mounted directly to the substrate" means that the LEDs are mounted directly to the substrate that forms the heat sink without any intervening elements or components other than the connection mechanism used to accomplish the mount such as solder, thermal adhesive or the like.

In one embodiment, the enclosure 112 and base 102 are dimensioned to be a replacement for an ANSI standard A19 bulb such that the dimensions of the lamp 100 fall within the ANSI standards for an A19 bulb. The dimensions may be different for other ANSI standards including, but not limited to, A21 and A23 standards. In some embodiments, the LED lamp 100 may be equivalent to standard watt incandescent light bulbs. However, the form factor of the lamp and the light output may be different than standard bulb configurations.

With respect to the features described above with various example embodiments of a lamp, the features can be combined in various ways. The LEDs 127 may comprise an LED die disposed in an encapsulant such as silicone, and LEDs which may be encapsulated with a phosphor to provide local wavelength conversion, as will be described later when various options for creating white light are discussed. A wide variety of LEDs and combinations of LEDs may be used in as described herein. The LEDs 127 are operable to emit light when energized through an electrical connection. The LEDs 127 may comprise an LED die disposed in an encapsulant such as silicone, and LEDs which are encapsulated with a phosphor to provide local wavelength conversion, as will be described later when various options for creating white light are discussed. For example, the various methods of including phosphor in the lamp can be combined and any of those methods can be combined with the use of various types of LED arrangements such as bare die vs. encapsulated or packaged LED devices. The embodiments shown herein are examples only, shown and described to be illustrative of various design options for a lamp with an LED array.

LEDs and/or LED packages used with an embodiment of the invention and can include light emitting diode chips that emit hues of light that, when mixed, are perceived in combination as white light. Phosphors can be used as described to add yet other colors of light by wavelength conversion. For example, blue or violet LEDs can be used with the appropriate phosphor. LED devices can be used with phosphorized coatings packaged locally with the LEDs or with a phosphor coating the LED die as previously described. For example, blue-shifted yellow (BSY) LED devices, which typically include a local phosphor, can be used with a red phosphor to create substantially white light, or combined with red emitting LED devices in the array to create substantially white light. A lighting system using the combination of BSY and red LED devices referred to above to make substantially white light can be referred to as a BSY plus red or "BSY+R" system. In such a system, the LED devices used include LEDs operable to emit light of two different colors. A further detailed example of using groups of LEDs emitting light of different wavelengths to produce substantially while light can be found in issued U.S. Pat. No. 7,213,940, which is incorporated herein by reference.

Figure 5:
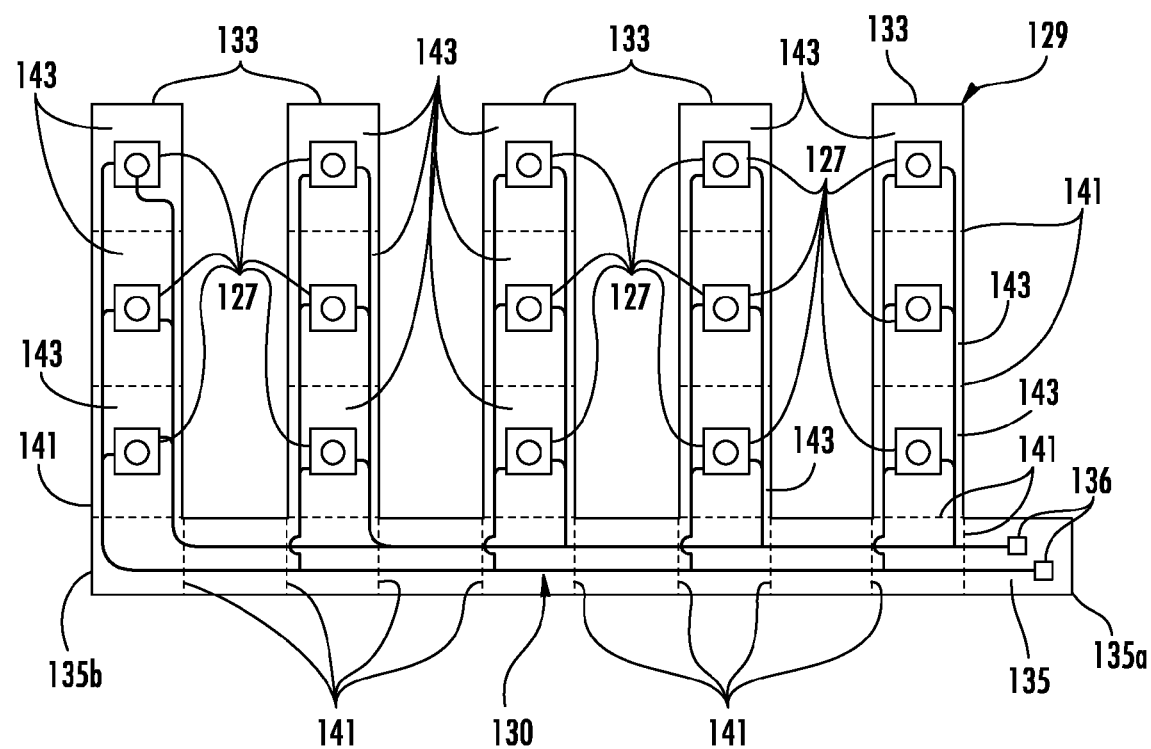
FIG. 5 is a plan view of a substrate usable in embodiments of the lamp of the invention.

Referring to FIG. 5 one embodiment of an LED substrate 129 is shown comprising a plurality of fingers 133 where each finger supports at least one LED 127. The fingers 133 are connected to one another by a connective support 135 that physically supports the fingers 133. The fingers 133 and support 135 may be formed of a single piece of material. For example the substrate 129 may comprise a stamped or cut member. Wire traces or conductors 130 may be formed on the substrate 129 for providing current to the LEDs 127 such that the substrate 129 forms part of the electrical path between the lamp electronics and the LEDs 127. The wire traces 130 may terminate in contact pads 136 for electrically connecting the substrate to the conductors 109 from the base 102 such as by a soldered connection or a spring biased contact connection.

In the embodiment illustrated in FIG. 5 five fingers 133 are shown each supporting three LEDs 127. A wide variety of shapes and sizes of the substrate 129, fingers 133, support 135 and LEDs 127 may be used. The number of fingers, their placement and the number and locations of the LEDs are selected to develop a desired light pattern for a desired lamp configuration and may vary from that shown in the figures. The number of LEDs may be increased or decreased from that shown in the figures to change the luminosity and/or color output of the lamp, for power or heat considerations or for other reasons. Further, the arrangement of the support 135 and fingers 133, and the corresponding arrangement of the LEDs 127 on the enclosure may be varied to create different light patterns for different types of lamps. For example, the LEDs may be positioned to create an omnidirectional lamp such as an A19 equivalent lamp, a BR-style or PAR-style directional lamp or other styles of lamps. Numerous configurations of both standard and nonstandard lamps may be provided.

In one embodiment the substrate 129 is a relatively thin, planar member made of a relatively pliant material such as aluminum, copper, flexible PCB, MCPCB or the like such that the substrate may be bent or otherwise deformed to have a desired shape. The substrate may also be formed such as by a stamping process, or other process, where the shape of the substrate is formed during fabrication of the substrate. In one embodiment the substrate may be bent along predetermined "score lines" 141. The score lines 141 may comprise thinned areas of the substrate. By bending the substrate 129 along the score lines 141 the mounting areas 143 on which the LEDs 127 are mounted remain planar. However, in other embodiments the substrate may be bent more gradually over all or a large portion of the substrate such that the bend of the substrate is more gradual without sharp bend lines. The substrate may be bent over its entire surface provided that the bending of the substrate does not adversely affect the mechanical, thermal and electrical connection between the LEDs and the substrate. The substrate 129 is formed into a three-dimensional shape that comprises portions that are shaped to conform to the shape of the enclosure 112 such that when the substrate 129 is mounted to the enclosure 112 the substrate 129 forms a generally contiguous part of the enclosure 112, is at least partially exposed to the ambient environment and fits the form factor of the lamp. The LEDs on the substrate 129 are disposed at the enclosure 112 and face generally toward the interior of the enclosure. A three-dimensional shape means that the substrate comprises mounting surfaces for the LEDs that are in more than one plane such that the LEDs are directed in more than one direction relative to the axis of the lamp. While the substrate in FIG. 5 is shown with sharp corners the substrate may be formed with rounded corners and other shapes for aesthetic purposes or to better fit the enclosure as shown in other figures.

As previously described, the enclosure 112 may be formed with apertures 108 that are arranged over the surface of the enclosure such that the substrate 129 fits into the apertures 108 in the assembled lamp. The substrate 129 may be formed with a wide variety of patterns and the substrate may be shaped into a wide variety of shapes to fit a wide variety of enclosure shapes and sizes and to provide a variety of LED patterns.

Figure 6:
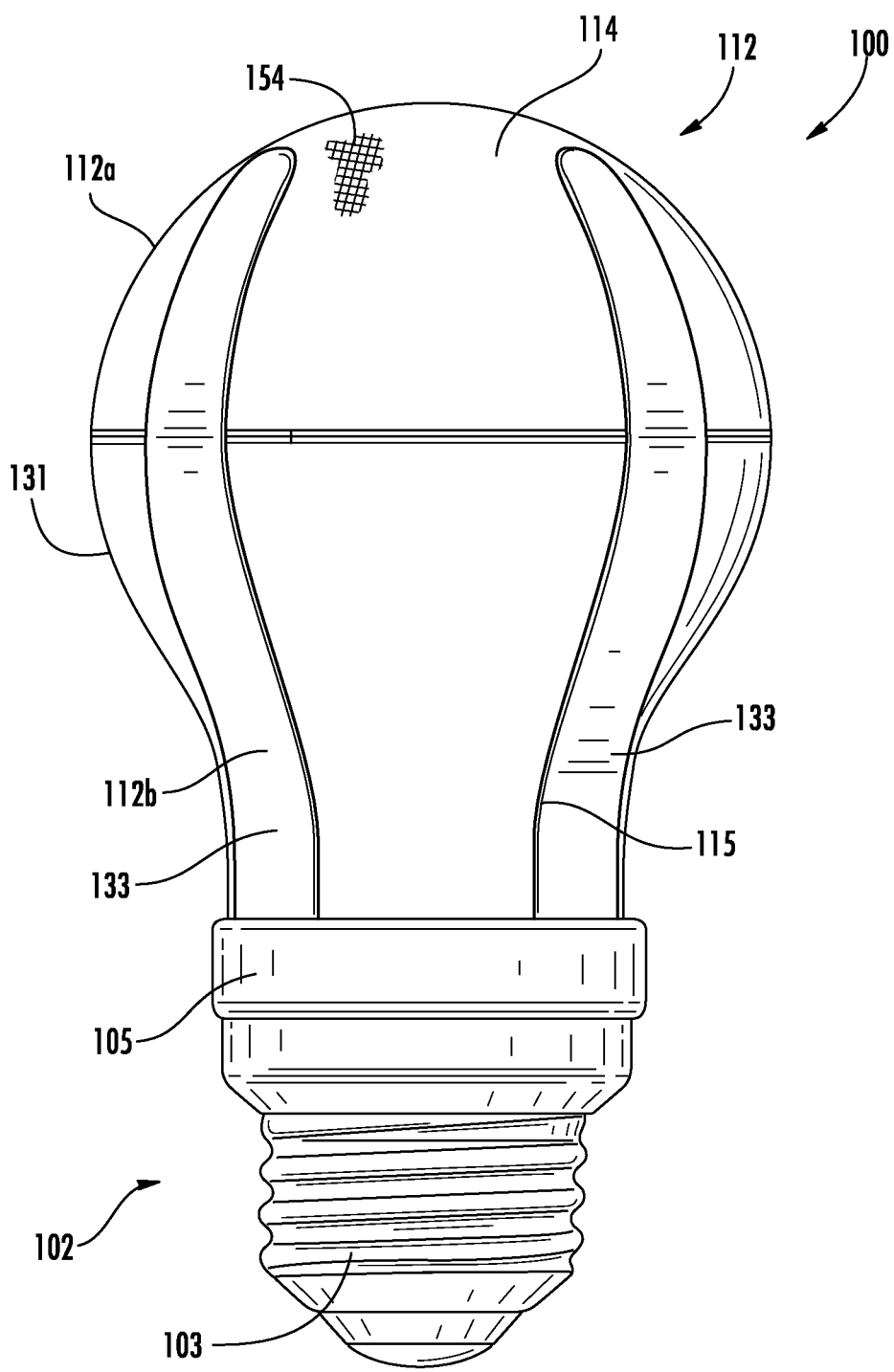
FIG. 6 is a plan view of an alternate embodiment of a lamp of the invention.

As shown in FIG. 5, in one embodiment the substrate 129 is formed with a support 135 having a plurality of fingers 133 extending from one side thereof. The LEDs 127 are arranged on the fingers 133 such that the LEDs all face the same direction. The support 135 is configured such that it may be bent into a generally circular ring as shown in FIG. 4 where a first end 135a of the support is brought adjacent to the opposite end 135b of the support. The support 135 is dimensioned such that it fits the form factor of the lamp in the area adjacent to the base 102, lower portion 115 of the enclosure 112 or the area between the base and the enclosure. The support may be positioned between the base 102 and the enclosure 112, it may be fit into or over the base or it may be fit into or over the enclosure. In some embodiments the base 102 may be connected directly to the enclosure 112 with the support 135 positioned inside of or outside of the enclosure 112 and/or base 102 and in other embodiments the support 135 may form the connection between the base 102 and the enclosure 112. For example, as shown in FIG. 1 the support 135 is positioned outside of the enclosure 112 and is exposed to the ambient environment such that the support 135 forms part of the heat dissipating portion of the substrate 129. The support 135 may be connected to the base 102 and/or enclosure 112. Referring to FIG. 6, the support 135 may be disposed in the enclosure and/or base 102 such that it is not visible in the assembled lamp. The substrate 129 is arranged such that a sufficient portion of the substrate 129 is exposed to the ambient environment that heat is dissipated from the LEDs primarily through the substrate. In some embodiments the back or outside surface of the substrate 129 is completely exposed to the exterior of the lamp and in other embodiments a major portion, but not all, of the outside surface of the substrate is exposed to the exterior of the lamp.

When the base is formed into a ring as previously described, the fingers 133 extend from one side of the support 135 with the LEDs 127 facing inwardly. The fingers 133 extend away from the support 135 toward the distal end of the lamp with the LEDs facing generally inwardly. The fingers 133 may be bent or otherwise formed to follow the curvature of the enclosure 112 such that the fingers 133 are located in the apertures 108 and form part of the enclosure. The fingers 133 may be formed with a lateral curvature, i.e. across the short dimension of the fingers, to form a substantially contiguous surface with the enclosure as shown in FIG. 2. While the fingers 133 are described as fitting into apertures 108 formed in the enclosure 112 the enclosure may be formed of a plurality of segments or sections that are connected to the substrate 129 and/or to one another to create the assembled enclosure.

Because the substrate 129 follows the curvature of the enclosure, the LEDs 127 may be located on the substrate such that the LEDs face at various angles relative to the longitudinal axis of the lamp. As illustrated in FIGS. 3 and 4 the substrate 129 follows the general curvature of the enclosure 112 where the LEDs 127 located toward the distal end of the lamp may face somewhat toward the base 102 while the LEDs located near the base 102 of the lamp may face somewhat toward the distal end of the lamp. The center LEDs may face directly toward the longitudinal axis of the lamp. As a result, light may be directed by various ones of the LEDs toward the top, bottom or sides of the lamp to achieve a desired light pattern. While in the illustrated embodiment, the LEDs 127 are located on each of the fingers 133 in a similar location, the LEDs 127 may be located on the fingers 133 in different locations on the fingers such that the some of the LEDs may be disposed at more or less of an angle relative to the axis of the bulb than other ones of the LEDs to facilitate the generation of any suitable light pattern. Moreover, selected ones of the fingers 133 may support a greater or fewer number of LEDs 127 than other ones of the fingers.

Figure 15:
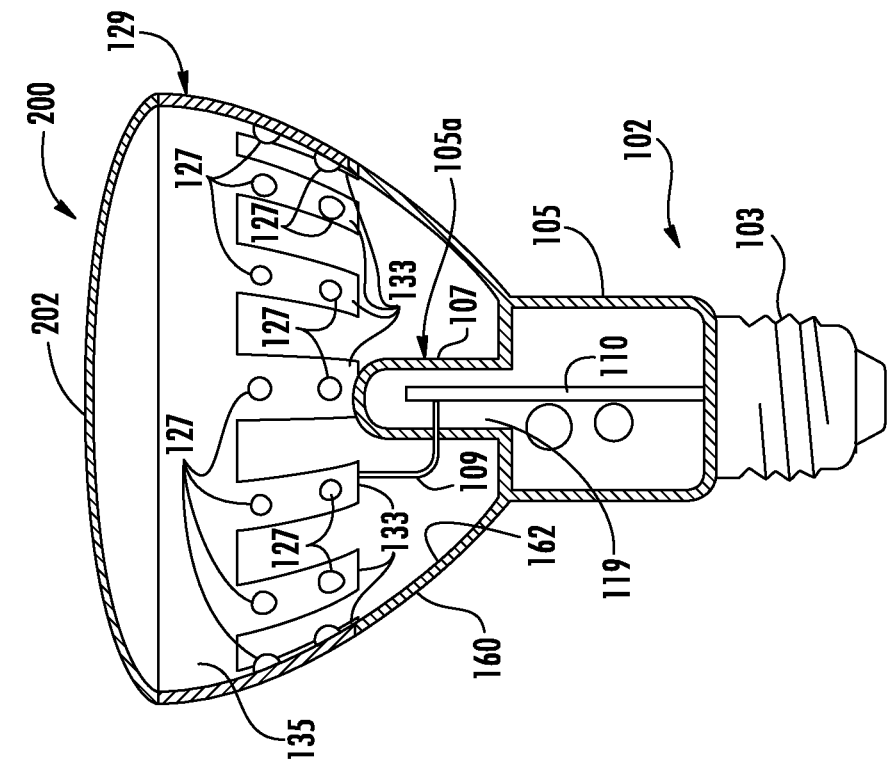
FIG. 15 is a vertical section view of an embodiment of the lamp of the invention.
Figure 14:
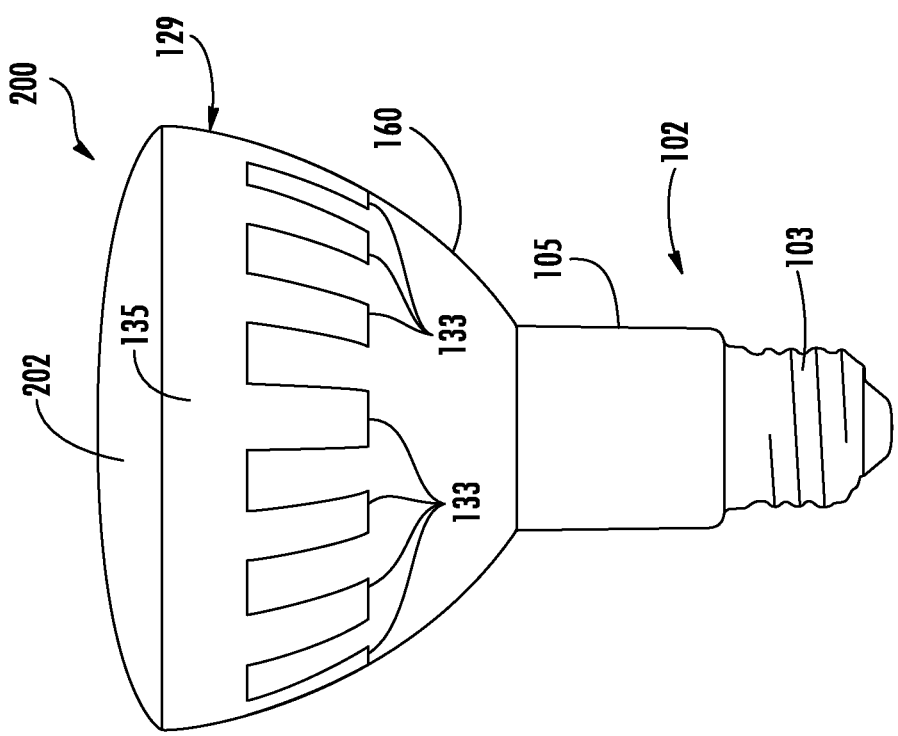
FIG. 14 is a plan view of another embodiment of the lamp of the invention.

Another embodiment of the lamp and substrate is shown in FIGS. 14 and 15. FIGS. 14 and 15 show a directional lamp 200 that may be used as a replacement for an incandescent bulb such as BR bulb, such as a BR30 or similar bulb, a PAR bulb or other similar bulb. The lamp of the invention includes a base 102 that may comprise an Edison connector 103 and a housing 105 as previously described. The enclosure 160 may be connected to base 102. Enclosure 160 may comprise a reflective interior surface 162 that reflects light in a desired pattern. The reflective surface 162 may be a parabolic reflector such as found in a PAR style bulb for reflecting the light in a relatively tight pattern or the reflective surface 162 may have other shapes such as conical for reflecting the light in a wider pattern such as may be found in a BR style bulb. Further, the reflective surface may be formed on the enclosure or it may be formed as a separate component inside of the enclosure. The reflective surface may be an opaque plastic component made of reflective white material or it may be a specular surface. The reflective surface 162 may also be formed on the inside of a transparent plastic or glass enclosure and may be for example be made of a reflective aluminum layer. Other constructions of the reflective surface and enclosure are possible.

Figure 9:
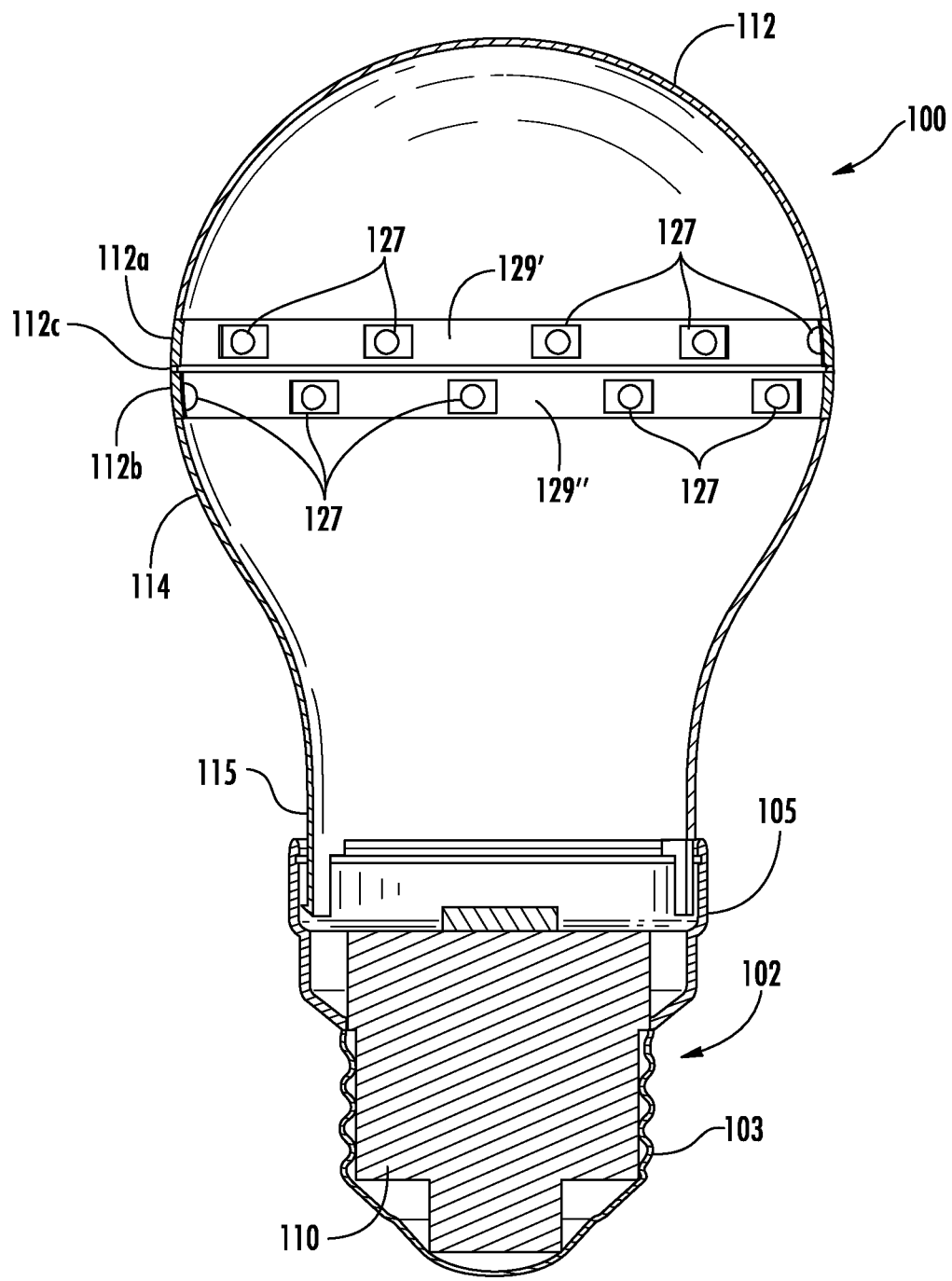

A substrate 129 is located on the enclosure 160 as previously described such that the support 135 is formed into a ring where the ring circumscribes the distal edge of the enclosure 160. The support 135 may include LEDs 127 operable to emit light. Moreover, the support 135 may support fingers 133 that extend toward the base 102 and that conform to the shape of the enclosure 160 such that the fingers 133 and support 135 form a portion of the enclosure 160. The exit surface 202 of the lamp may comprise a lens made of for example, diffused glass or polycarbonate. The lens 202 may be secured to the support 135 of substrate 129 such that the support 135 is connected between the lamp enclosure 160 and the lens 202. The substrate 129 may be connected to the enclosure 160 and lens 202 using a mechanical connection, adhesive, welding, other connection mechanism or a combination of such mechanisms. In some embodiments, such as the embodiment shown in FIGS. 14 and 15, the LEDs 127 and substrate 129 are separated by a significant physical distance or space from the power supply that forms part of lamp electronics 110 and base 102 to keep the thermal coupling between these elements low. As shown in FIG. 14 the power supply and other lamp electronics 110 may be located in the base 102 where the ends of the fingers 133 are spaced from the base 102 by a significant distance. An electrical conductor 109 may electrically connect the substrate 129 to the electronics 110 in the base 102; however, the thermal path between the substrate 129 and LEDs 127 and the lamp electronics 110 is only through the electrical conductor where the substrate 129 and LEDs 127 are otherwise physically separated from the base 102. The electrical conductor 109 may be designed to minimize the heat transfer between the LEDs and the lamp electronics 110. For example, the conductor 109 may be made significantly long to increase the thermal path. As a result heat generated by the LEDs 127 is dissipated from the lamp via substrate 129 without heating the power supply as contrasted to lamps where the heat sink and support substrate for the LEDs are physically close to the power supply in or near the base. Thermally decoupling the substrate 129 and LEDs 127 from the power supply may provide particular thermal advantages in directional lamps such as PAR and BR style lights because these lamps tend to be used in recessed lighting housings where the lamps are located in closed or partially closed housings where air flow may be limited and the internal ambient temperature may reach over 50° C. Decoupling the heat generated by the LEDs from the power supply can extend the life of the power supply, which may include electrolytic capacitors. While the substrate 129 and LEDs 127 are shown physically spaced from the base in a directional lamp in FIGS. 14 and 15 these elements may be physically spaced from one another and thermally decoupled in an omnidirectional lamp such as shown in FIGS. 7 and 9.

Figure 16:
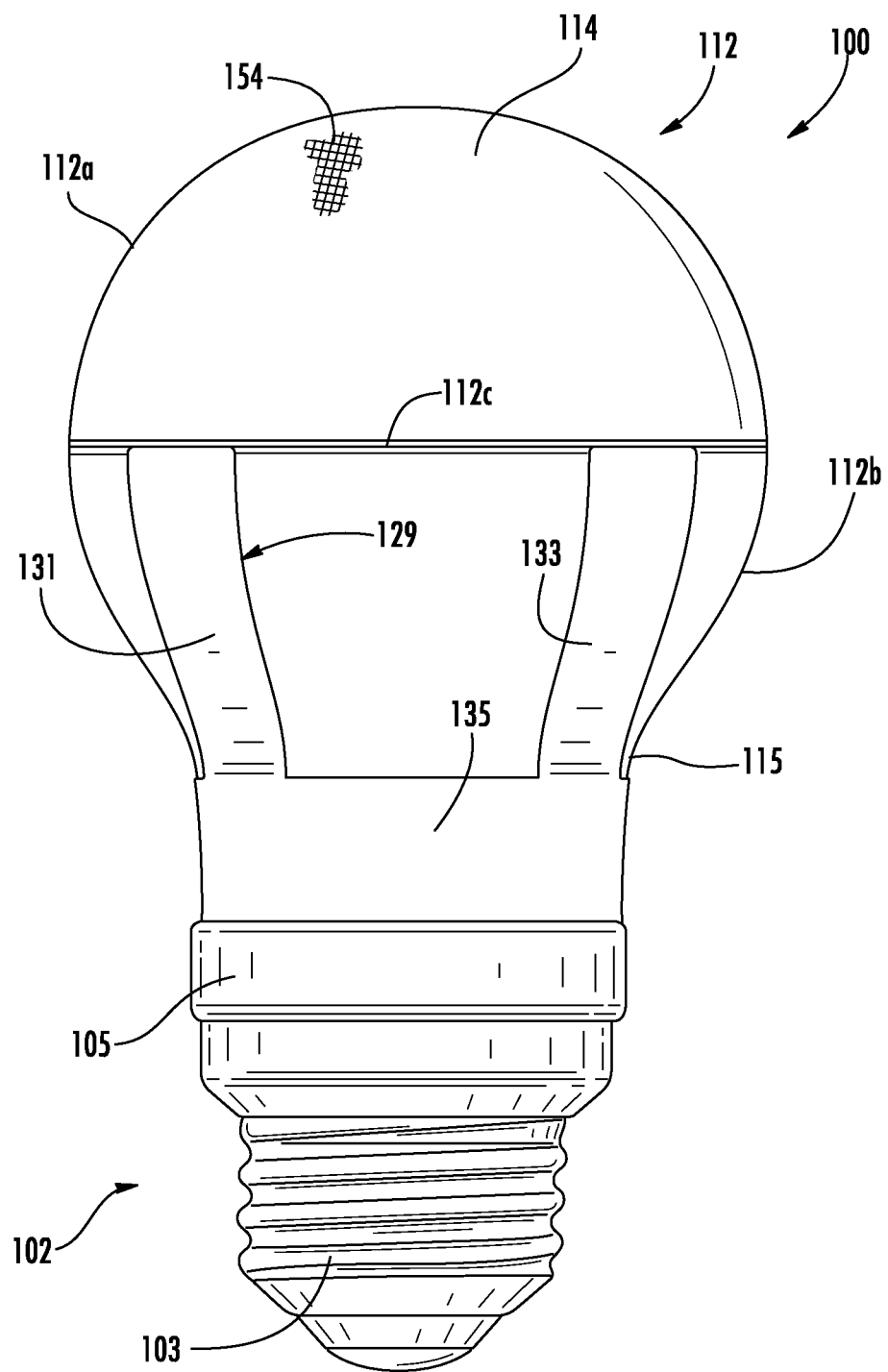
FIG. 16 is a plan view of another embodiment of the lamp of the invention.

Another embodiment of a lamp is shown in FIG. 16 where an omnidirectional lamp 100 is illustrated where the support 135 of the substrate 129 is formed into a ring and fingers 133 extend from the ring toward the distal end of the bulb as previously described with reference to the embodiment of FIG. 1. However, in the embodiment of FIG. 16 the fingers 133 extend only to the equator 112c of the enclosure 112. This allows the upper half 112a of the enclosure 112 to be made as a light transmissive hemisphere that is uninterrupted by the substrate 129. Such an arrangement provides a lamp enclosure that has the more familiar look of an incandescent bulb. Each finger 133 may support two LEDs where one of the LEDs is mounted on a vertical plane near the equator of the enclosure and the other of the LEDs is mounted near the support 135 at a 45° angle relative to vertical such that it emits light more toward the distal end of the bulb. Other arrangements and numbers of the LEDs may be used.

Referring again to FIG. 15, the housing 105 comprises a housing portion 105a that extends into the center of the enclosure 160 and that may contain portions of the power supply or other lamp electronics 110. A reflective surface 107 may be provided over the exterior surface of the housing portion 105a such that the housing portion 105a acts a reflector to reflect some of the inwardly directed light outwardly toward the enclosure. The reflective surface 107 may be a specular of a diffuse reflector. The housing portion 105a may be molded of white plastic or the housing portion 105a may be covered in a reflective film, coating or paint. The reflective surface 107 may be smooth or it may be faceted and it may be provided in a variety of shapes such as the illustrated cylinder, a dome, a polyhedron or the like. The various arrangements of the reflective surface may be used to shape the light emitted from the lamp. While the interior housing portion 105a is shown in a directional lamp the housing portion 105a may be used in an omnidirectional lamp such as shown in FIG. 1. In some embodiments, the housing portion 105a may be hollow to define an interior space 119 for receiving lamp electronics, a power supply or other lamp components. In other embodiments the interior of the housing portion 105a may be empty or it may be a solid member.

Figure 7:
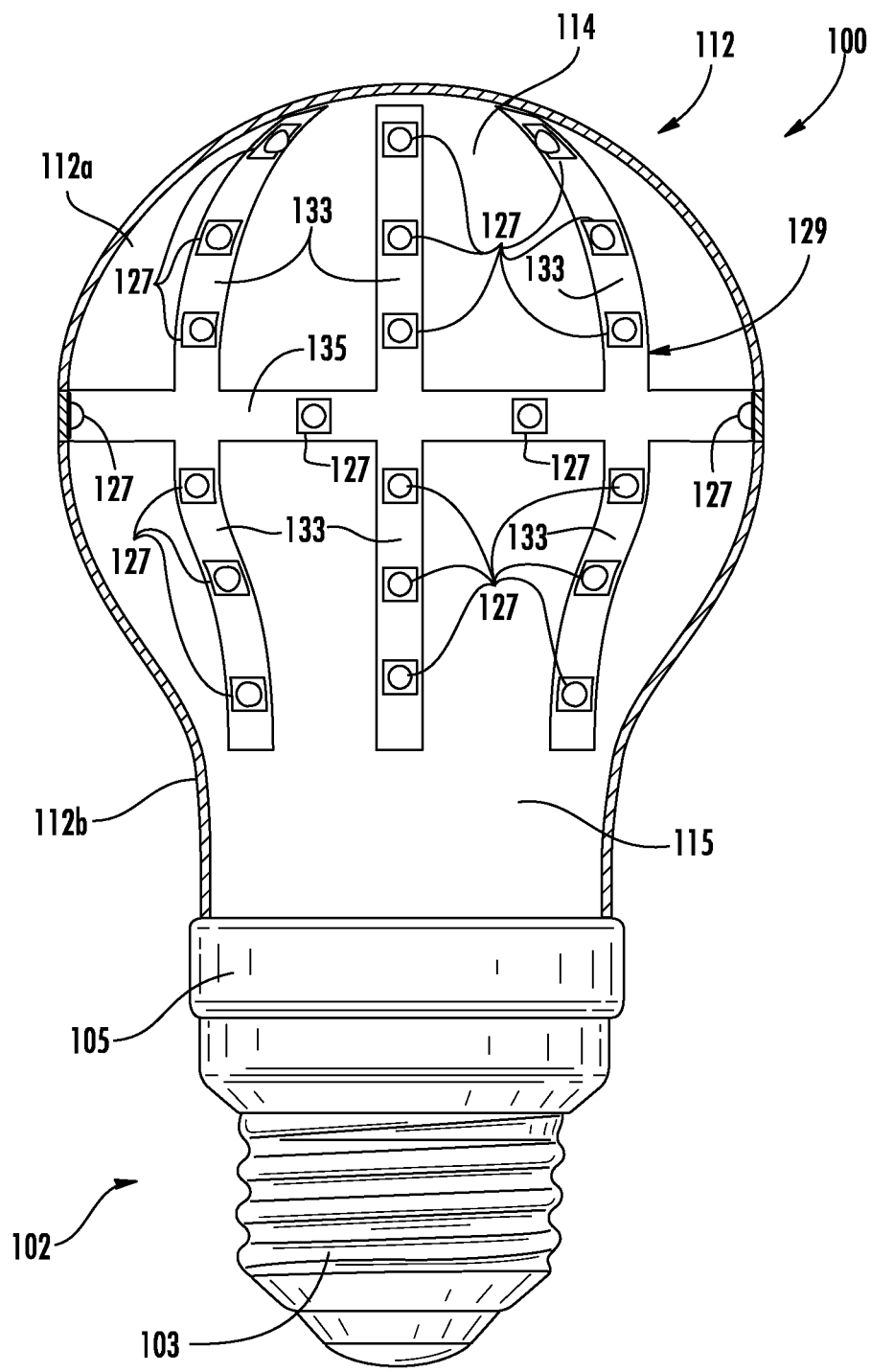
FIGS. 7 through 9 are partial section views showing alternate embodiments of the lamp of the invention.

Another embodiment of a lamp and substrate is shown in FIG. 7. In the embodiment of FIG. 7 the fingers 133 extend from both sides of the support 135. Further, the support 135 also supports a plurality of the LEDs 127 such that LEDs are located both on the fingers 133 and on the connective support 135. In such an embodiment, the connective support 135 may be located at the approximate center line or equator of the enclosure with the fingers 133 extending above and below the support 135. The support 135 may be positioned between the enclosure portions 112a and 112b with the fingers located in apertures 108. In some other embodiments, the support 135 may be located above or below the equator of the enclosure and the length of the fingers and the number of LEDs supported by the support and fingers may vary from that shown.

Figure 8:
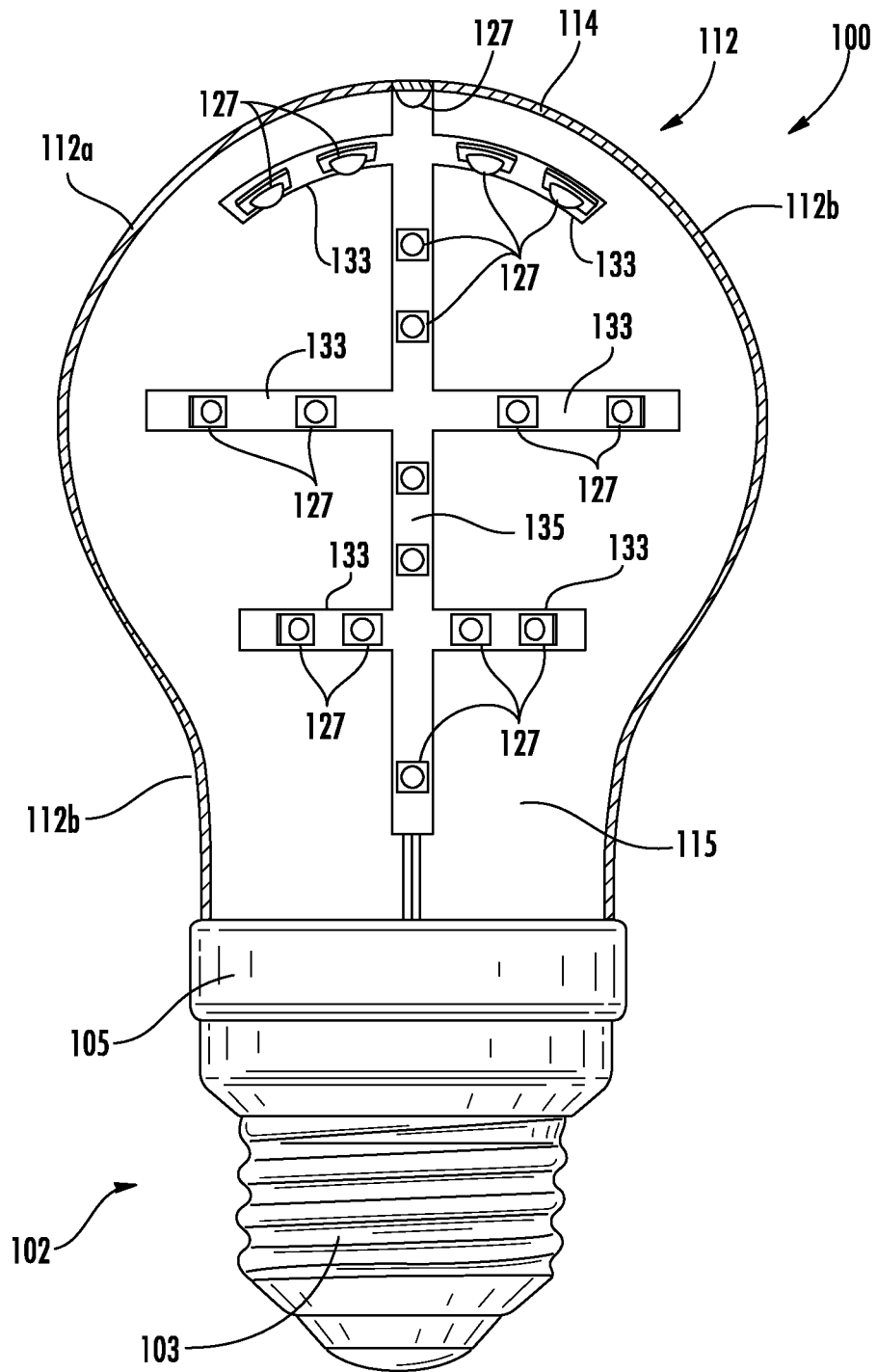

In other embodiments the connective support 135 may be disposed on a longitudinal line of the bulb as shown in FIG. 8 where the support may extend from adjacent the base 102 over the distal end of the enclosure 112 toward the base on the opposite side of the enclosure 112. The fingers 133 may extend laterally from both sides of the connective support 135. LEDs may be supported on the support 135 and the fingers 133. In the embodiment of FIG. 8 the enclosure portions 112a and 112b may comprise left and right portions of the enclosure rather than top and bottom portions.

The substrate 129 may also comprise more than one piece. For example, as shown in FIG. 9, the substrate 129 may comprise a first substrate portion 129' and a second substrate portion 129" each supporting at least one LED 127. The substrate portions may be mounted to the enclosure 112 separately and the electrical path may be connected from the base 102 to each substrate portion 145, 146 individually or the substrate portions may be connected in series. In the illustrated embodiment two substrate portions are provided each comprising a single band that extends about the approximate equator of the enclosure portions 112a and 112b, respectively.

Figure 10:
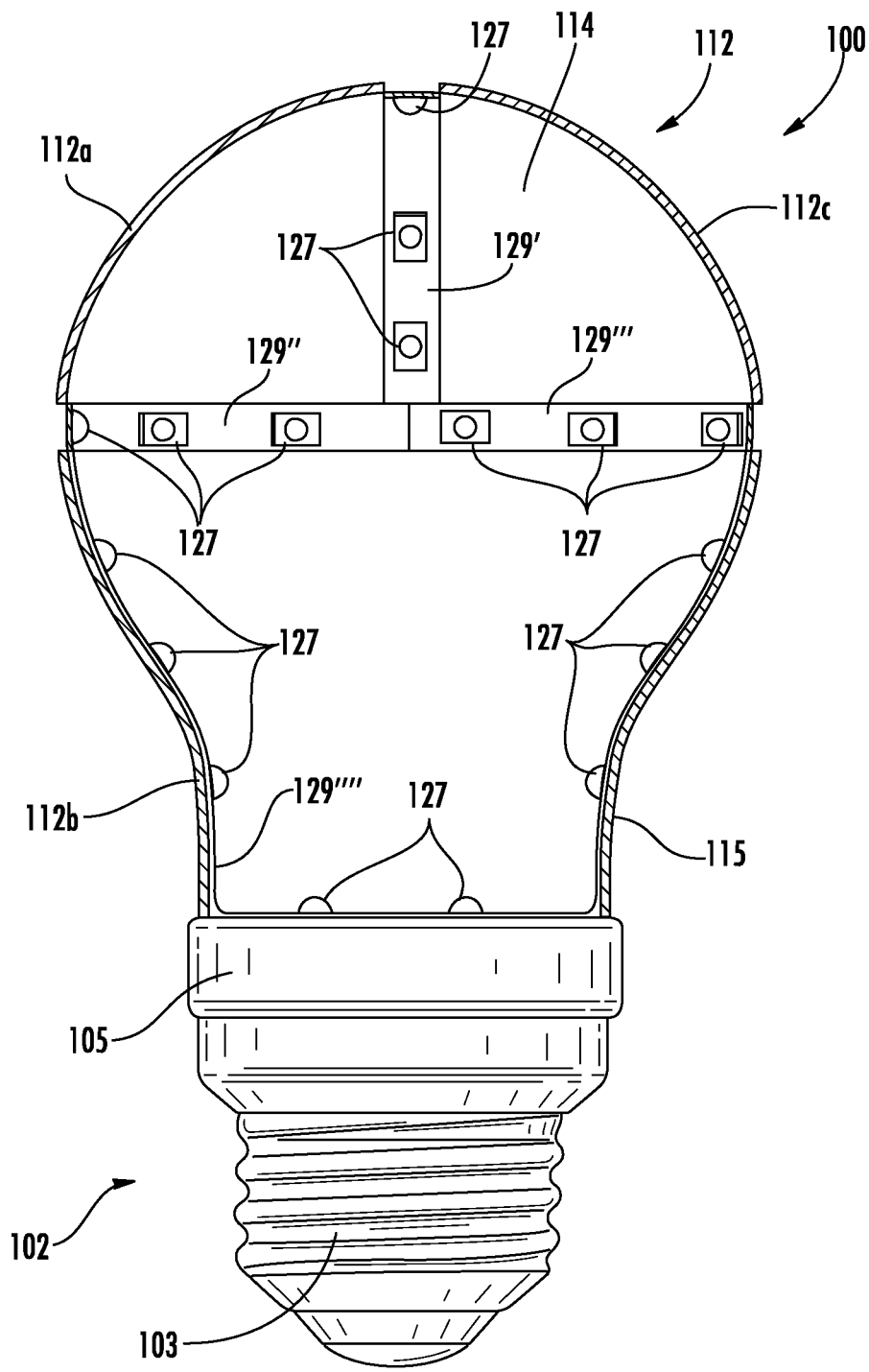
FIG. 10 is a partial section view showing an alternate embodiment of the lamp of the invention and FIG. 11 is a partial section view of the lamp of FIG. 10 taken along a section line at 90 degrees from the view of FIG. 10.
Figure 11:
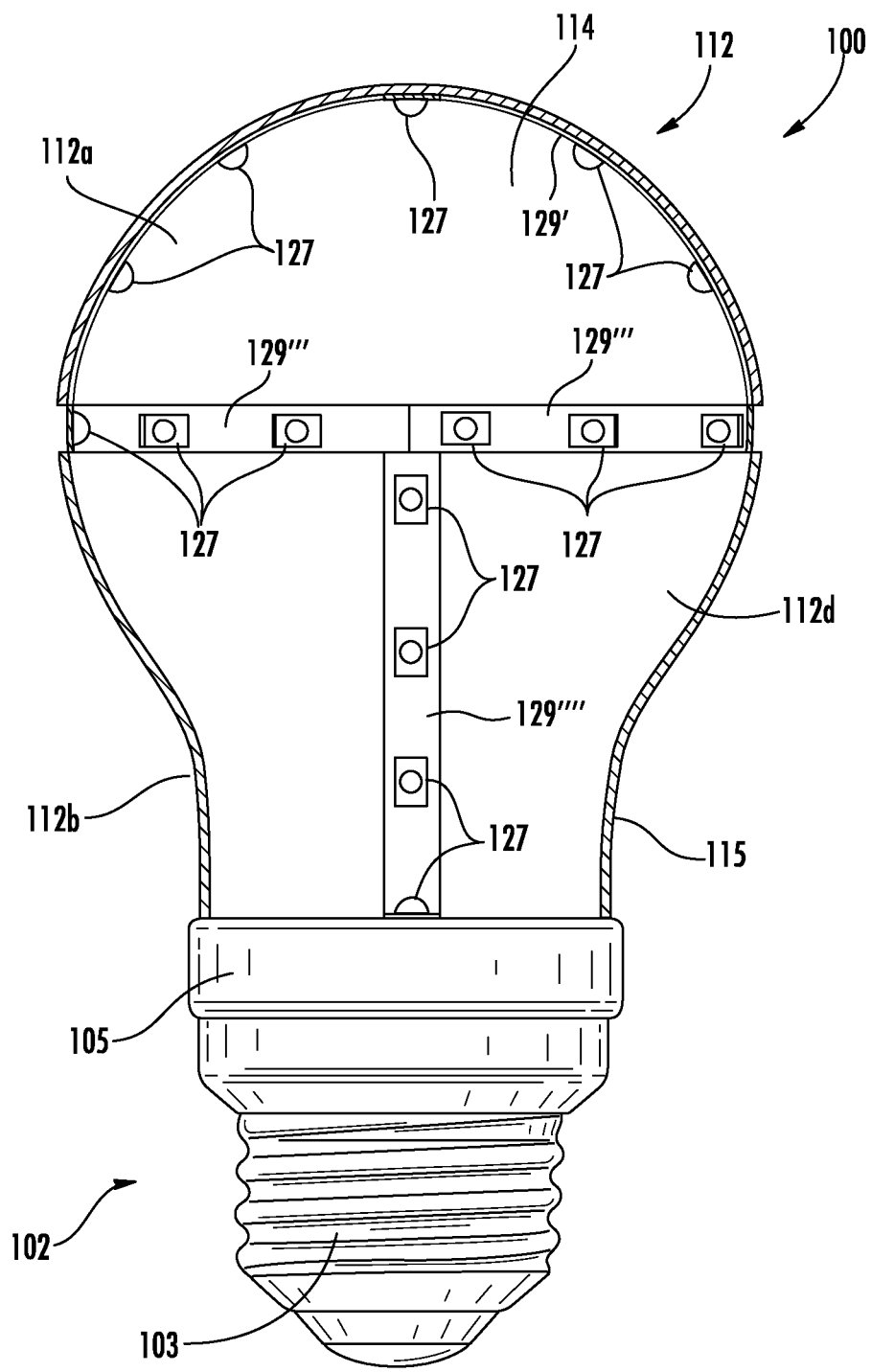

In FIGS. 10 and 11 four substrates 129', 129", 129'" and 129"" are provided each formed as an arc of the circle extending about a portion of the periphery of the enclosure. The first substrate 129' extends over the distal end of the enclosure between the approximate equator of the enclosure 112. The second substrate 129" extends for approximately one half of the equator of the enclosure and the third substrate 129'" extends for approximately the other half of the equator of the enclosure. Finally, the fourth substrate 129"" extends from support 129" across the base 102 at the bottom of the enclosure 112 and to support 129'". The fourth substrate 129"" may extend across the base 102 such that LEDs 127 located on substrate 129"" may be disposed near the base of the lamp and may be oriented to project light toward the distal end of the base. In the embodiment of FIGS. 10 and 11 the enclosure may comprise four enclosure portions 112a, 112b, 112c and 112d where the substrates 129', 129", 129'" and 129"" are located between the enclosure portions 112a, 112b, 112c and 112d. Alternatively, rather than using four substrate portions, a fewer number of substrate portions may be used to create the same arrangement by bending or otherwise forming the substrate portions to have more complex shapes.

Figure 12:
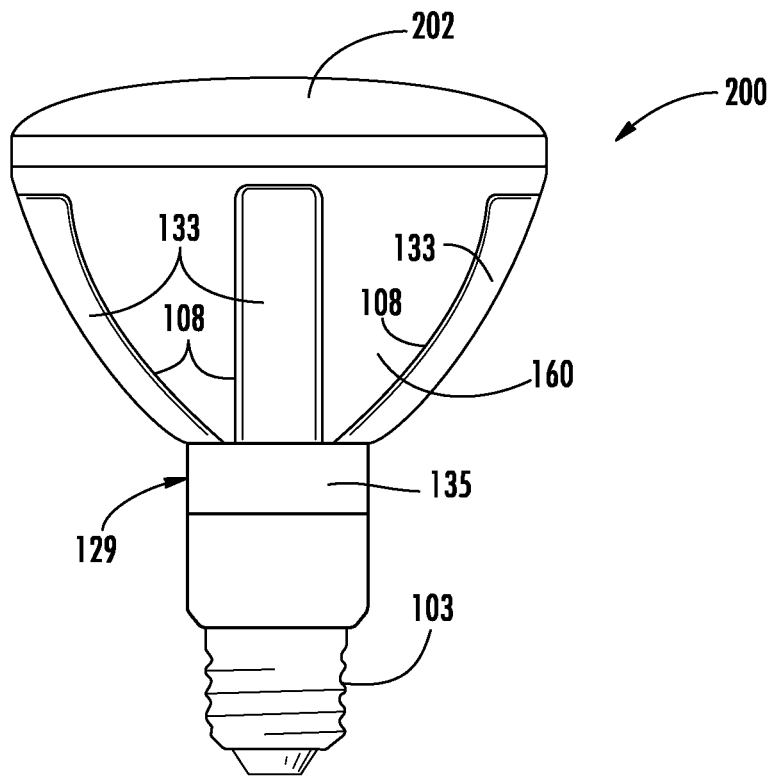
FIG. 12 is a plan view of an alternate embodiment of a lamp of the invention.

FIG. 12 shows a PAR or BR style lamp 200 using the substrate of the invention. The substrate 129 is arranged as described with respect to FIG. 1 where a support 135 has a plurality of fingers 133 extending from a first side thereof. The support 135 is bent into a generally circular shape such that the fingers 133 extend from one side of the support 135 with the LEDs facing inwardly. The fingers 133 are bent such that the shape of the fingers conforms to the shape of the enclosure 160 of the reflector chamber of the lamp 200. The fingers 133 may be located in apertures 108 formed in the enclosure 160 such that the LEDs are disposed inside of the enclosure on one surface of the substrate and the opposite surface of the substrate is exposed to the exterior of the lamp. The LEDs direct light inwardly where the interior reflective surface of the enclosure 160 reflects the light in the desired pattern out of exit surface 202.

The surface area of the substrate 129 is selected such that the substrate is able to conduct sufficient heat away from the LEDs and disperse the heat to the ambient environment such that the performance of the LEDs is not degraded to an unacceptable level. The size of the substrate may be dictated by the heat generated by the LEDs, the number of LEDs used, the type of lamp, its use environment or the like.

The use of the mounting substrate 129 for the LEDs 127 as the heat sink eliminates the need to provide a separate component as the heat sink making the lamp of the invention simpler and less expensive to manufacture. For example, some heat sinks are complex shapes that require intricate and expensive tooling that are custom cast or machined aluminum. Moreover, in a typical LED lamp the board or substrate on which the LEDs are mounted must also be connected to the heat sink using screws or other connectors, thermal interface material (such as thermal grease), thermal epoxy or the like. In the lamp of the invention the complex and expensive heat sinks found on typical LED lamps are eliminated. Not only does the heat sink arrangement of the invention lower the cost and complexity of manufacture, the elimination of a separate heat sink may also make it easier for the LED lamp to have a form factor that fits into the envelope for a standard light bulb such as a standard A19, PAR or BAR envelope. While specific bulb standards are discussed herein the lamp of the invention may assume other standard and or non-standard form factors. While in the previous embodiments the LEDs are mounted on an interior surface of the substrate and are inwardly facing, in some embodiments, some of the LEDs may be outwardly facing.

The substrate 129 typically has a significantly larger surface area than the LED board used in a standard LED lamp in order to provide enough surface area to efficiently act as a heat sink. However, the increase in cost associated with using a larger substrate to mount the LEDs is lower than the cost of a separate heat sink structure and associated assembly costs. In the embodiments described herein and in other embodiments of the invention the LEDs may have a variety of orientations in the enclosure. The LEDs may be arranged such that they are facing upwardly, downwardly, laterally or at other angles relative to the lamp. The number and types of LEDs, and their angles and locations may be varied to change the light distribution pattern of the lamp.

Figure 13:
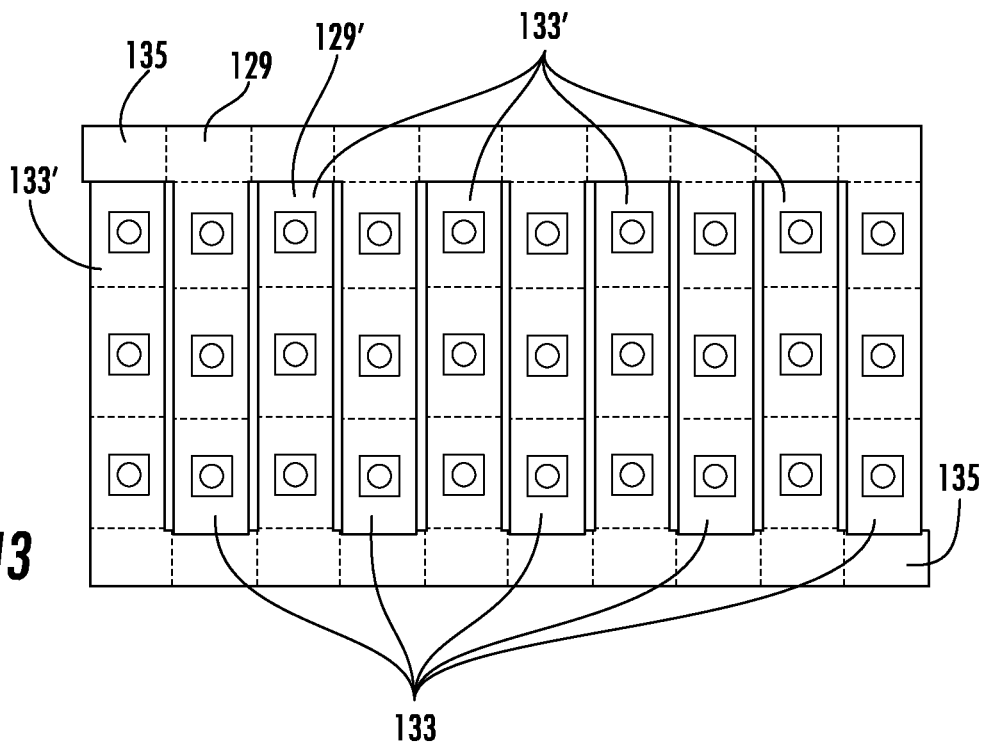
FIG. 13 is a plan view of a substrate configuration usable in the manufacture of the lamp of the invention.

To manufacture the lamp, a substrate 129 made of a thermally conductive material such as aluminum is made in a desired shape as described above. The material may be pliable to facilitate the shaping of the substrate. For increased manufacturability and less waste the substrate 129 may be cut from a sheet of material such that multiple substrates are cut in an efficient manner. For example, referring to FIG. 13 the substrates may be cut from a sheet of material where the fingers 133 of one substrate 129 interdigitate with the fingers 133' of a second substrate 129' such that little material is wasted. The LEDs 127 are attached directly to the substrate 129 using any suitable attachment mechanism such as soldering. An electrical connection is provided to the LEDs. In one embodiment the electrical connection is formed as wire traces 130 (FIG. 5) on the substrate such as by using selective deposition technology to create the traces on a dialectric material, by using MCPCB's or the like. In other embodiments the electrical connection may be made of off the substrate such as by using a separate conductor such as a wire. The substrate is bent or otherwise formed into the desired shape.

The substrate 129 with the LEDs 127 is mounted to enclosure 112. The substrate 129 may be mounted to the enclosure 112 in a variety of manners. The substrate 129 may be attached to the enclosure by adhesive, welding, a mechanical connection, other methods or a combination of such methods. In one embodiment of a mechanical connection, the substrate 129 may be secured to the enclosure 112 by retaining a portion of the substrate between other components of the lamp. For example, the substrate 129 may span the openings 108 and include retaining portions that are trapped between, for example, the enclosure portions 112a and 112b and/or the enclosure and the base. Connectors may also be molded into the enclosure 112 which are engaged by mating connectors on the substrate 129. For example, the enclosure 112 may comprise female receptacles or male engagement members 155 that receive mating male engagement members or female receptacles 156 formed on the substrate 129. The engagement members may be retained in the receptacles by a friction fit, mechanical engagement, adhesive and/or the like. The substrate may also be insert molded into the enclosure 112 during molding of the plastic enclosure. The substrate 129 is mounted on the enclosure such that the back surface of the substrate opposite to the mounting surface for the LEDs is exposed to the ambient environment where it dissipates heat from the lamp. While in one embodiment the back surface of the substrate is exposed, any surface of the substrate may be exposed to the ambient environment provided it effectively dissipates heat. Where the substrate 129 comprises a support 135 the support may also be exposed to the exterior of the lamp to increase thermal transmission. The electrical connectors from the substrate, such as traces 130, are connected to the lamp electronics in the base via electrical conductors 109 such that an electrical path is created between the base and the LEDs. The base 102 may then be connected to the enclosure 112 and/or substrate 129 to complete the lamp. The enclosure 112 may be secured to the base 102 using adhesive or a snap-fit connector such as elastic locking members 160 on one of the base and the enclosure (FIG. 4) that mate with corresponding members on the other one of the base and enclosure.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A LED lamp comprising:
   an enclosure that is at least partially optically transmissive defining an interior and an exterior, the enclosure comprising an exterior surface having a curvature;
   a base connected to the enclosure;
   a plurality of LEDs mounted on a mounting surface of a substrate for emitting light when energized though an electrical path from the base, the substrate comprising an electrical conductor in the electrical path for providing current to the plurality of LEDs, wherein the enclosure comprises apertures and the substrate comprises portions that fit into the apertures, the portions supporting at least one LED positioned in the interior, the substrate having a surface that is exposed to the exterior of the enclosure for transmitting heat from the plurality of LEDs and dissipating heat to the ambient environment wherein the surface of the substrate and the mounting surface are the same physical component, the substrate being formed to conform to the curvature of the exterior surface of the enclosure such that the substrate does not protrude beyond the exterior surface.

2. The lamp of claim 1 wherein the base comprises an Edison base.

3. The lamp of claim 1 wherein the plurality of LEDs are disposed near an interior surface of the enclosure and are positioned to direct light primarily inwardly toward a center of the enclosure.

4. The lamp of claim 1 wherein the plurality of LEDs are disposed about the periphery of the enclosure.

5. The lamp of claim 1 wherein the substrate is made of a single one-piece part.

6. The lamp of claim 1 wherein the substrate is made of a plurality of separate parts.

7. The lamp of claim 1 wherein the substrate is made of a thermally conductive material.

8. The lamp of claim 1 wherein the surface of the substrate is generally smooth.

9. The lamp of claim 1 wherein the plurality of LEDs are mounted directly to the substrate.

10. The lamp of claim 1 wherein the substrate is approximately 0.25 mm to 5 mm thick.

11. The lamp of claim 1 wherein the outer dimensions of the lamp fall within the ANSI standards for an A19 bulb.

12. The lamp of claim 1 wherein the substrate comprises one of aluminum board, flexible PCB, PCB and MCPCB.

13. The lamp of claim 1 wherein the substrate is bent along score lines.

14. The lamp of claim 1 wherein the score lines comprise thinned areas of the substrate.

15. The lamp of claim 1 wherein the plurality of LEDs face at various angles relative to the longitudinal axis of the lamp.

16. The lamp of claim 1 wherein a sufficient portion of the substrate is exposed to the ambient environment that heat is dissipated from the plurality of LEDs via the substrate to prevent degradation of the plurality of LEDs.

17. The lamp of claim 1 wherein a power supply is located in the base and the substrate is physically spaced from the base.

18. The lamp of claim 1 wherein the portions comprise a plurality of fingers where each finger supports at least one LED.

19. The lamp of claim 18 wherein the plurality of fingers are connected to one another by a support.

20. The lamp of claim 19 wherein the plurality of fingers and the support are formed of a single piece of material.

21. The lamp of claim 19 wherein the support is generally ring shaped.

22. The lamp of claim 19 wherein the support is positioned between the base and the enclosure.

23. The lamp of claim 19 wherein the support is positioned inside the base.

24. The lamp of claim 19 wherein the support is positioned outside of the enclosure.

25. The lamp of claim 19 wherein the plurality of fingers extend from one side of the support with the plurality of LEDs facing inwardly.

26. The lamp of claim 19 wherein the plurality of fingers extend from both sides of the support.

27. The lamp of claim 19 wherein the support is located at the approximate equator of the enclosure with the fingers disposed above and below the support.

28. The lamp of claim 19 wherein the support is positioned between a first and a second enclosure portion.

29. The lamp of claim 19 wherein the support is disposed on a longitudinal line of the bulb.

30. The lamp of claim 19 wherein the fingers extend from the support toward the distal end of the bulb and extend only to the equator of the enclosure.

31. A LED lamp comprising:
an enclosure that is at least partially optically transmissive defining an interior and an exterior, the enclosure comprising an exterior surface having a curvature;
a base connected to the enclosure;
a plurality of LEDs mounted on a mounting surface of a substrate for emitting light when energized though an electrical path from the base, the substrate comprising an electrical conductor in the electrical path for providing current to the plurality of LEDs, wherein the enclosure comprises and the substrate comprises portions that fit into the apertures, the portions supporting at least one LED positioned in the interior, the substrate having a surface that is exposed to the exterior of the enclosure for transmitting heat from the plurality of LEDs and dissipating heat to the ambient environment wherein the surface of the substrate and the mounting surface are the same physical component, the substrate being formed to follow the curvature of the exterior surface of the enclosure such that the surface forms a generally contiguous part of the enclosure, wherein the portions comprise a plurality of fingers where each finger supports at least one LED and the plurality of fingers are connected to one another by a support where the support is positioned between a first and a second enclosure portion.

32. A LED lamp comprising:
an enclosure that is at least partially optically transmissive;
a base connected to the enclosure;
a plurality of LEDs mounted on a substrate for emitting light when energized though an electrical path from the base, the substrate having a surface that is exposed to the exterior of the enclosure for transmitting heat from the plurality of LEDs and dissipating heat to the ambient environment, wherein the lamp is a directional lamp comprising a reflective surface, the substrate being mounted on the enclosure between the enclosure and a lens such that it is physically spaced from the base.

33. The lamp of claim 32 wherein the lens defines an exit surface of the lamp.

34. The lamp of claim 32 wherein the substrate comprises a support mounted between the enclosure and a lens.

35. The lamp of claim 34 further comprising a plurality of fingers extending from the support toward the base.

36. The lamp of claim 32 comprising a housing portion that extends into the center of the enclosure wherein the housing portion contains at least a portion of the lamp electronics.

37. The lamp of claim 36 wherein a reflective surface is provided on an exterior surface of the housing portion such that the housing portion reflects light outwardly toward the enclosure.

38. A LED lamp comprising:
an enclosure that is at least partially optically transmissive defining an interior and an exterior, the enclosure comprising an exterior surface having a curvature;
a base connected to the enclosure;
a plurality of LEDs mounted on a mounting surface of a substrate for emitting light when energized though an electrical path from the base, the substrate comprising at least one of aluminum board, flexible PCB, PCB and MCPCB and comprising an electrical conductor in the electrical path for providing current to the plurality of LEDs, wherein the enclosure comprises apertures and the substrate comprises portions that fit into the apertures, the portions supporting at least one LED positioned in the interior, the substrate having a surface that is exposed to the exterior of the enclosure for transmitting heat from the plurality of LEDs and dissipating heat to the ambient environment wherein the surface of the substrate and the mounting surface are the same physical component, the substrate being formed to conform to the curvature of the exterior surface of the enclosure such that the substrate does not protrude beyond the exterior surface.

* * * * *